United States Patent
Kwon et al.

(10) Patent No.: US 8,105,934 B2
(45) Date of Patent: Jan. 31, 2012

(54) BUMP STRUCTURE FOR A SEMICONDUCTOR DEVICE AND METHOD OF MANUFACTURE

(75) Inventors: Yonghwan Kwon, Suwon (KR); Chungsun Lee, Anyang (KR); Sayoon Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 95 days.

(21) Appl. No.: 12/461,459

(22) Filed: Aug. 12, 2009

(65) Prior Publication Data

US 2009/0305494 A1    Dec. 10, 2009

Related U.S. Application Data

(62) Division of application No. 11/091,869, filed on Mar. 29, 2005, now abandoned.

(30) Foreign Application Priority Data

Apr. 14, 2004  (KR) .............................. 2004-0025853

(51) Int. Cl.
    *H01L 21/44*    (2006.01)
(52) U.S. Cl. ............................... 438/613; 257/E21.575
(58) Field of Classification Search .................. 438/613, 438/121, 108, 612, 666; 257/E21.575
    See application file for complete search history.

(56) References Cited

U.S. PATENT DOCUMENTS

| | | | |
|---|---|---|---|
| 5,047,644 A | 9/1991 | Meissner et al. | |
| 5,264,326 A | 11/1993 | Meissner et al. | |
| 5,508,228 A | 4/1996 | Nolan et al. | |
| 5,604,977 A * | 2/1997 | Robinson et al. | 29/825 |
| 5,783,465 A | 7/1998 | Canning et al. | |
| 6,284,563 B1 | 9/2001 | Fjelstad | |
| 6,486,000 B2 | 11/2002 | Kang | |
| 6,537,854 B1 | 3/2003 | Chang et al. | |
| 6,664,176 B2 | 12/2003 | Helder et al. | |
| 7,154,176 B2 | 12/2006 | Huang et al. | |
| 2002/0048924 A1 | 4/2002 | Lay et al. | |
| 2002/0115236 A1 | 8/2002 | Fjelstad et al. | |
| 2002/0130412 A1 | 9/2002 | Nagai et al. | |
| 2004/0175657 A1* | 9/2004 | Danovitch et al. | 430/311 |
| 2004/0238941 A1* | 12/2004 | Satoh et al. | 257/698 |
| 2005/0191836 A1 | 9/2005 | Tzeng et al. | |

FOREIGN PATENT DOCUMENTS

| | | |
|---|---|---|
| CN | 1111402 | 11/1995 |
| CN | 1344017 | 4/2002 |
| CN | 1601737 | 3/2005 |
| JP | 62-205648 | 9/1987 |
| JP | 2-272737 | 11/1990 |

(Continued)

OTHER PUBLICATIONS

Office Action for corresponding Japanese Application No. 2005-115158 dated May 11, 2010.

(Continued)

*Primary Examiner* — A. Sefer
*Assistant Examiner* — Dilinh Nguyen
(74) *Attorney, Agent, or Firm* — Harness, Dickey & Pierce, P.L.C.

(57) ABSTRACT

A semiconductor device employing the bump structure includes a plurality of bump structures arrayed along a substrate in a first direction. Each bump structure has a width in the first direction greater than a pitch gap between successively arrayed bump structures, and at least one bump structure has a sidewall facing in the first direction that is non-conductive.

11 Claims, 9 Drawing Sheets

FOREIGN PATENT DOCUMENTS

| | | |
|---|---|---|
| JP | 2002-118138 | 4/2002 |
| JP | 2003-338518 | 11/2003 |
| KR | 2003-0089288 | 11/2003 |

OTHER PUBLICATIONS

Office Action for corresponding Chinese Application No. 2005100649588 dated Oct. 31, 2008.
Office Action for corresponding Chinese Application No. 2005100649588 dated Jan. 25, 2008.
Korean Office Action dated Dec. 20, 2005 (with English translation).
German Office Action dated Dec. 1, 2005.
German Office Action dated Sep. 15, 2006.

\* cited by examiner

BUMP STRUCTURE FOR A SEMICONDUCTOR DEVICE AND METHOD OF MANUFACTURE

CROSS-REFERENCE TO RELATED APPLICATIONS

This application is a divisional of application Ser. No. 11/091,869, filed Mar. 29, 2005, now abandoned which claims priority on Korean Patent Application No. 2004-0025853, filed on Apr. 14, 2004 in the Korean Intellectual Property Office, which are both incorporated herein by reference in their entirety.

BACKGROUND OF THE INVENTION

A number of different techniques exist for providing electrical connection between a semiconductor chip or package and a circuit board or other substrate. The current trend in many of these techniques is the use of solder bumps to form electrical connections instead of wire bonding. For example, bumps are used in such techniques as tape carrier package (TCP), chip on film (COF), and chip on glass (COG). Often techniques such as TCP and COF are more broadly referred to as tape automated bonding (TAB).

While bumps provide an advantage over wire bonding by allowing for a reduction in the spacing between the solder bumps as compared to the spacing between wire bonds, even bump techniques face potential limitations on the spacing between the bumps. For example, in the COG technique, a semiconductor chip (e.g., a liquid crystal display (LCD) driver integrated circuit (IC) package) may be bonded directly to the LCD substrate. In this technique, ACF (anisotropic conductive film) tape is disposed between pads of the LCD substrate and the associated bumps on the driver IC package to form the electrical connection. ACF tape contains electrically conductive particles that are embedded in an insulating material. The conductive particles provide electrical connection between the solder bumps and the pads on the LCD substrate. As the gap between bumps, however, becomes smaller, the particles in the ACF tape may provide electrical connection between bumps; thus, causing a short circuit.

SUMMARY OF THE INVENTION

The present invention provides a bump structure that removes barriers on the spacing between solder bumps of semiconductor chips or packages. As such, the present invention allows for smaller and thinner semiconductor devices.

In one exemplary embodiment, a plurality of bump structures are arrayed along a substrate in a first direction. Each bump structure has a width in the first direction greater than a pitch gap between successively arrayed bump structures. The pitch gap may be thought of as a gap measured at the substrate along the first direction between planes of facing sidewalls of the successively arrayed bump structures. At least one bump structure has a sidewall facing in the first direction that is non-conductive. Because the sidewall is non-conductive, conductive particles disposed between this bump and the bump adjacent to the non-conductive sidewall should not form a short circuit between the two bumps.

In one exemplary embodiment, each bump structure has at least one non-conductive sidewall facing in the first direction.

In another exemplary embodiment, each bump structure has two oppositely facing non-conductive sidewalls facing in the first direction.

In a further exemplary embodiment, each bump structure has one non-conductive sidewall facing in the first direction and one conductive sidewall facing in the first direction such that the conductive sidewall does not face the conductive sidewall of another bump structure.

In a still further exemplary embodiment, the array of bump structures alternate from a first type to a second type. The bump structure of the first type has two oppositely facing non-conductive sidewalls that face in the first direction, and the bump structure of the second type has two oppositely facing conductive sidewalls that face in the first direction.

In association with any of the above described embodiments, the successively arrayed bump structures may be disposed offset from one another in a second direction along the substrate.

An exemplary embodiment of the present invention also includes a plurality of bumps arrayed along a substrate in a first direction and a plurality of conductive lines formed in a second direction. Each conductive line is associated with one of the bumps, and each conductive line is disposed over a top surface of the associated bump and over two oppositely facing sidewalls of the bump; the two oppositely facing sidewalls facing in the second direction. Each conductive line extends over the substrate from each of the two oppositely facing sidewalls. Because of this, the conductive line assists in maintaining the associated bump adhered to the substrate.

Other exemplary embodiments of the present invention provide for methods of forming the above described embodiments.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein:

FIGS. 10A-15B illustrate an embodiment of a method of fabricating a bump structure according to the present invention where FIGS. 10A, 11A, 12, 13A, 14 and 15A represent cross-sectional views of the substrate during the fabrication process, and FIGS. 10B, 11B, 13B and 15B represent top down views of the substrate during the fabrication process.

DETAILED DESCRIPTION OF EXEMPLARY EMBODIMENTS

The present invention provides a bump structure that removes barriers on the spacing between solder bumps of semiconductor chips or packages. As such, the present invention allows for smaller and thinner semiconductor devices. First, several structural embodiments according to the present invention will be described followed by a description of a method for forming a bump structure according to the present invention.

First Structural Embodiment

Figure 1:
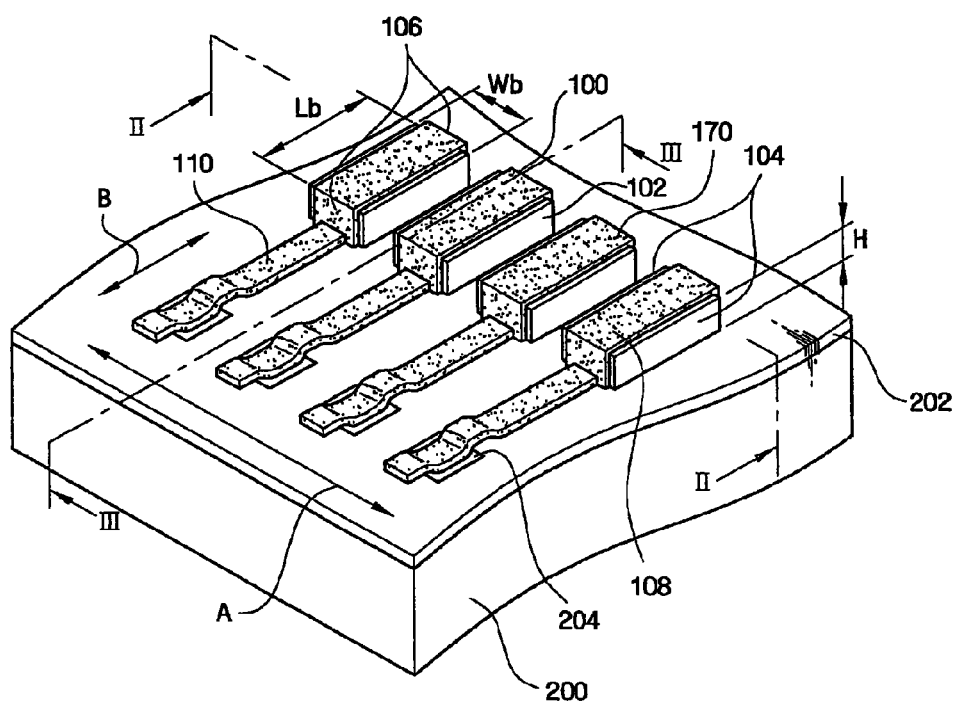
FIG. 1 illustrates a semiconductor device having a bump structure according to an exemplary embodiment of the present invention.

FIG. 1 illustrates a semiconductor device having a bump structure according to an exemplary embodiment of the present invention. As shown, bump structures 100 are arrayed on an insulating layer 202 over a substrate 200 in a first direction indicated by a double headed arrow A. Each bump structure 100 includes a non-conductive bump 102. The non-conductive bump 102 has two oppositely facing sidewalls 104 that face in the first direction and two oppositely facing sidewalls 106 that face in a second direction, substantially perpendicular to the first direction, indicated by a double headed arrow B.

In one example embodiment, each bump 102 has a height H of 2 to 30 um, a width Wb of 10 to 50 um and a length of 20 to 200 um.

Each bump structure 100 also includes a conductive layer 108 disposed over a top surface of an associated bump 102 and each sidewall 106 facing in the second direction. The conductive layer 108 on the bump 102 forms part of a conductive line 110 that extends a shorter distance over the substrate 200 from one sidewall 104, and extends a longer distance over the substrate 200 from the other sidewall 104. As shown, the conductive line 110 extends in the second direction. The longer extension of the conductive line 110 leads to an associated chip pad 204 where the conductive layer 110 is electrically connected to the associated pad 204. As will be appreciated the pad 204 provides electrical connection between the conductive line 110 and circuitry (not shown) formed on the substrate 200.

Figure 2:
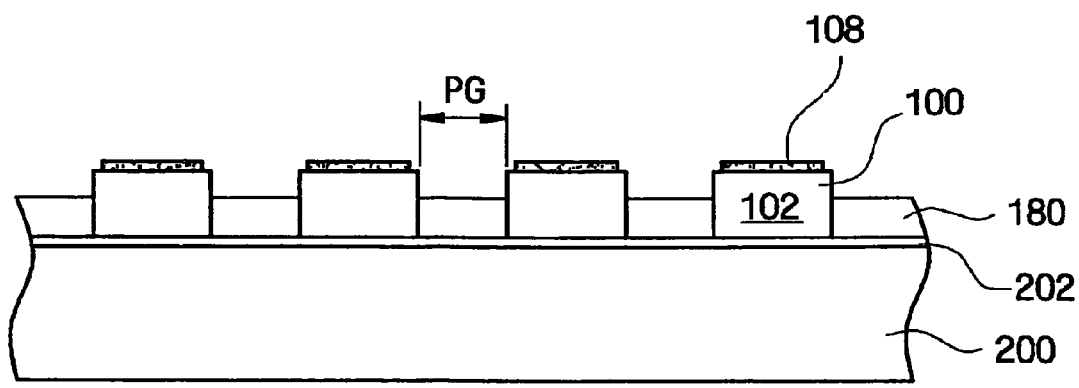
FIG. 2 illustrates a cross-section of the substrate shown in FIG. 1 along line II-II.
Figure 3:
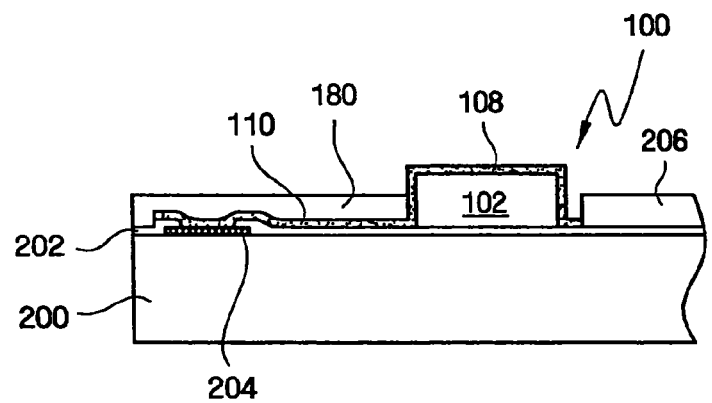
FIG. 3 illustrates a cross-section of the substrate shown in FIG. 1 along line III-III.

FIG. 2 illustrates a cross-section of the substrate shown in FIG. 1 along line II-II and FIG. 3 illustrates a cross-section of the substrate shown in FIG. 1 along line III-III. While not shown in FIG. 1 for the purposes of clarity, the bump structure according to this embodiment of the present invention further includes a passivation layer 180 formed over portions of the substrate 200 as shown in FIGS. 2 and 3.

FIG. 2 shows the pitch gap PG between consecutive bump structures 100 in FIG. 1. The pitch gap PG is the distance between two bump structures; and more particularly, may be the gap as measured at the substrate 200 or passivation layer 180 along the first direction between the planes in which facing sidewalls 104 of the successively arrayed bump structures 100 lie. In this embodiment, the width Wb of the bump structure 100 is greater than the pitch gap PG. For example, the pitch gap PG may be about 10 um.

Because the pitch gap PG is less than the width WBb of the bump structure 100, a short circuit when using, for example, an ACF tape might be expected. However, because the sidewalls 104 of the bump structures 100 facing in the first direction are non-conductive, such short circuits are prevented. Consequently, the present invention provides a bump structure that removes barriers on the spacing between solder bumps of semiconductor chips or packages. As such, the present invention allows for smaller and thinner semiconductor devices.

Second Structural Embodiment

Figure 4:
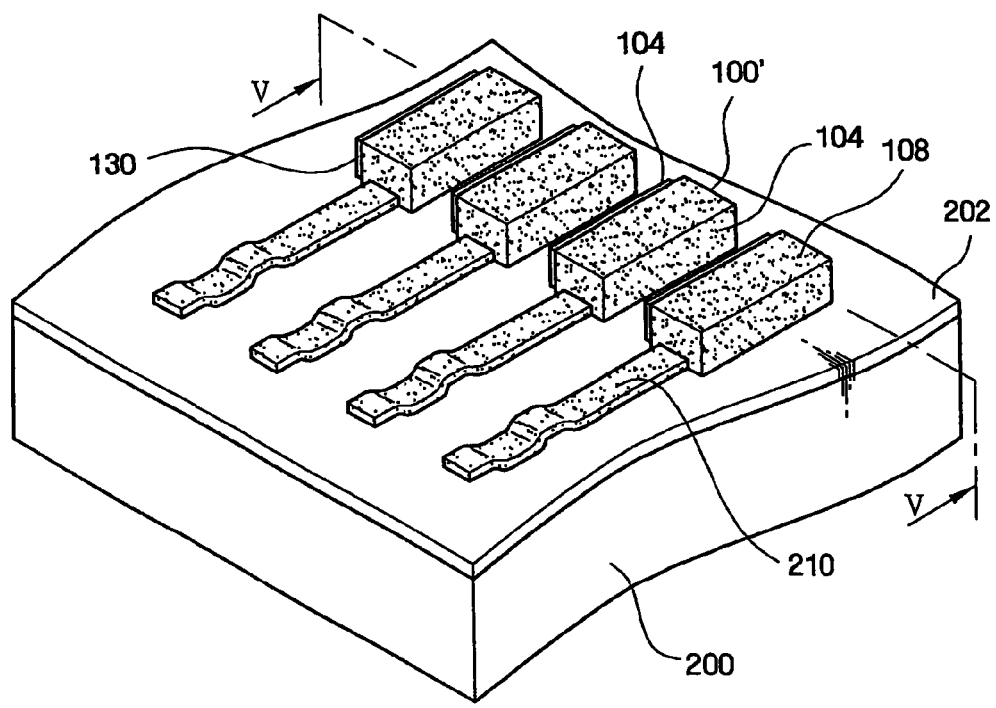
FIG. 4 illustrates a semiconductor device having a bump structure according to an exemplary embodiment of the present invention.
Figure 5:
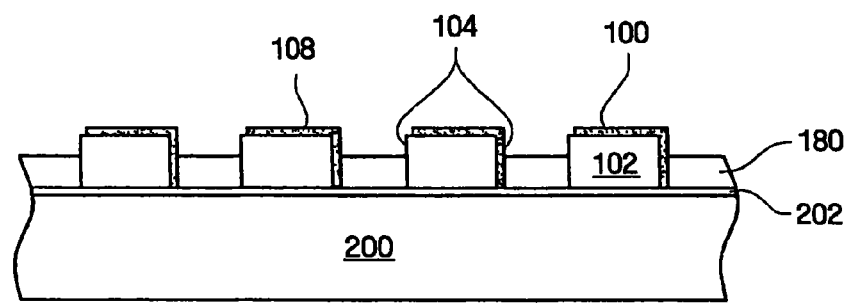
FIG. 5 illustrates a cross-section of the semiconductor device shown in FIG. 4 along line V-V.

FIG. 4 illustrates a semiconductor device having a bump structure according to an exemplary embodiment of the present invention, and FIG. 5 illustrates a cross-section of the semiconductor device shown in FIG. 4 along line V-V. As shown, the embodiment of FIG. 4 is the same as the embodiment of FIG. 1 except for the bump structures. In the embodiment of FIG. 4, each bump structure 100' is the same as the bump structure 100 shown in FIG. 1 except that the conductive layer 108 covers a same one of the sidewalls 104 facing in the first direction. As such, the conductive sidewall 104 of one bump structure 100 faces a non-conductive sidewall 104 of another bump structure 100.

Because one of the sidewalls 104 of the bump structures 100 facing in the first direction are non-conductive, short circuits are prevented. Consequently, the present invention provides a bump structure that removes barriers on the spacing between solder bumps of semiconductor chips or packages. As such, the present invention allows for smaller and thinner semiconductor devices.

Third Structural Embodiment

Figure 6:
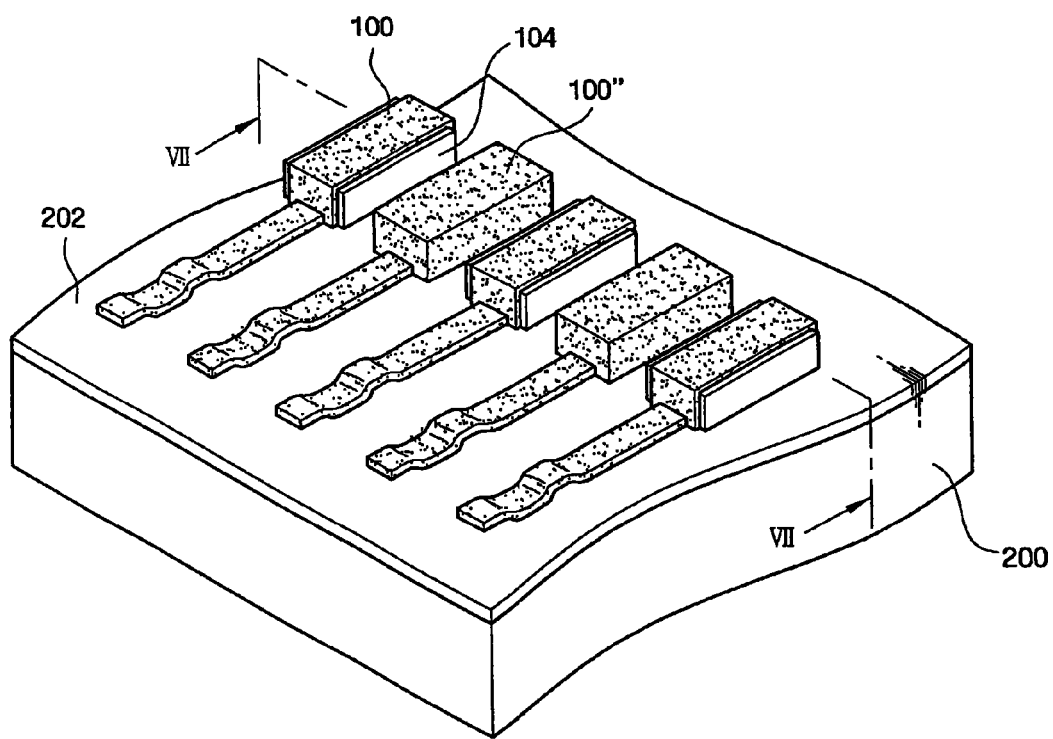
FIG. 6 illustrates a semiconductor device having a bump structure according to an exemplary embodiment of the present invention.
Figure 7:
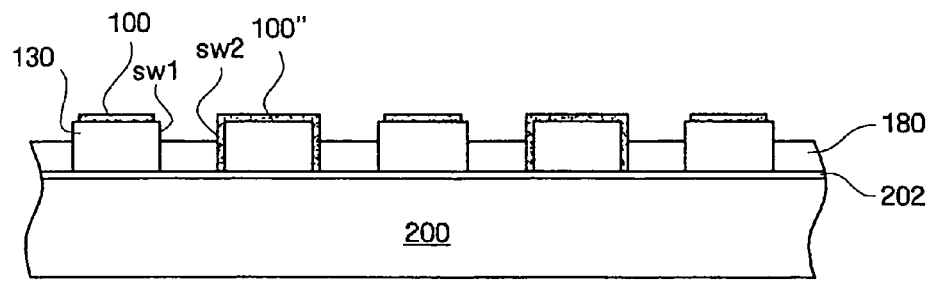
FIG. 7 illustrates a cross-section of the semiconductor device shown in FIG. 6 along line VII-VII.

FIG. 6 illustrates a semiconductor device having a bump structure according to an exemplary embodiment of the present invention, and FIG. 7 illustrates a cross-section of the semiconductor device shown in FIG. 6 along line VII-VII. As shown, the embodiment of FIG. 6 is the same as the embodiment of FIG. 1 except for the bump structures. The embodiment of FIG. 6 includes two alternating types of bump structures. The first type of bump structures 100 are the same as the bump structure 100 shown in FIG. 1. The second type of bump structures 100" are the same as the bump structure 100 shown in FIG. 1 except that the conductive layer 108 covers both of the sidewalls 104 facing in the first direction. However, because the two types of bump structures alternate along the first direction of the substrate 200, a conductive sidewall 104 of the second type of bump structure 100" faces a non-conductive sidewall 104 of the first type of bump structure 100. As a result, short circuits are prevented. Consequently, the present invention provides a bump structure that removes barriers on the spacing between solder bumps of semiconductor chips or packages. As such, the present invention allows for smaller and thinner semiconductor devices.

Fourth Structural Embodiment

Figure 8:
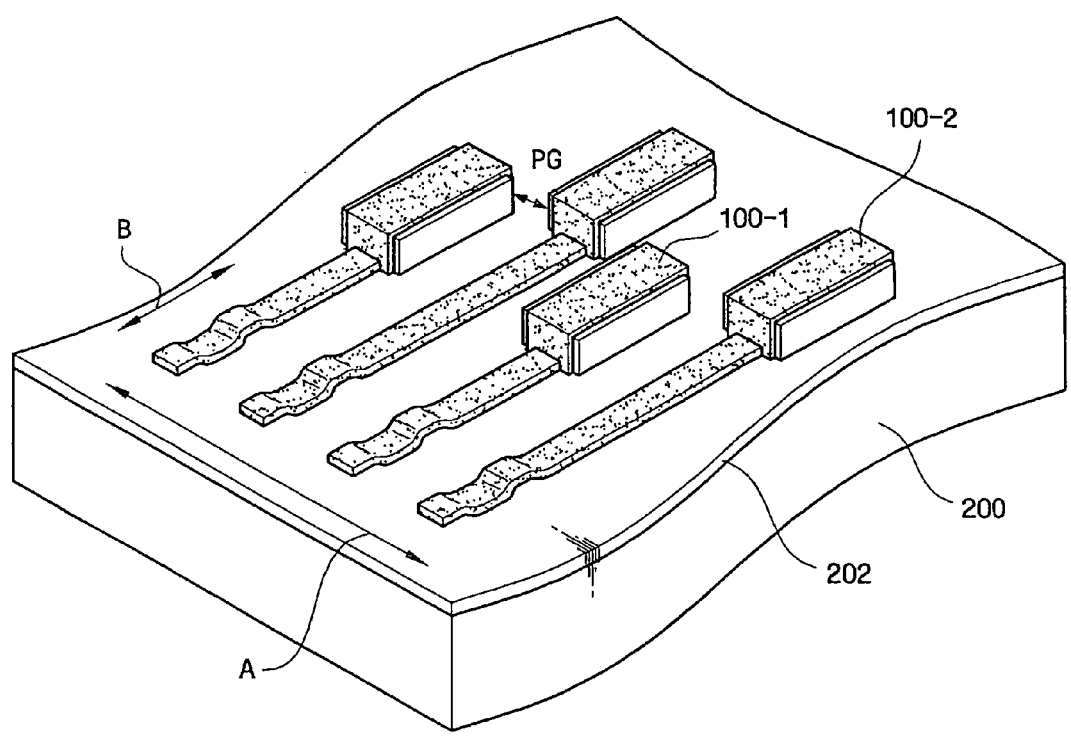
FIG. 8 illustrates a semiconductor device having a bump structure according to an exemplary embodiment of the present invention.

FIG. 8 illustrates a semiconductor device having a bump structure according to an exemplary embodiment of the present invention. As shown, the bump structure in FIG. 8 is the same as the bump structure shown in FIG. 1, except that the successively arrayed bump structures are disposed offset from one another in the second direction. More specifically, the bump structures 100 are divided into two groups. The bump structures 100-1 in the first group have shorter conductive lines 110 than the bump structures 100-2 in the second group, and bumps structures 100-1 of the first group alternate with bump structures 100-2 of the second group in the first direction.

As will be appreciated, offsetting the bump structures 100 as shown in FIG. 8 further assists in preventing possible short circuits. Because successive bump structures 100 are not aligned, a short circuit is less likely to occur, and because the gap between aligned bump structures is large (e.g., greater than 20 um), a short circuit is less likely to occur.

While the embodiment of FIG. 8 has been shown and described using the bump structures 100 of FIG. 1, it will be appreciated that this embodiment may be used in conjunction with the bump structures of any of the previously described embodiments.

Figure 9:
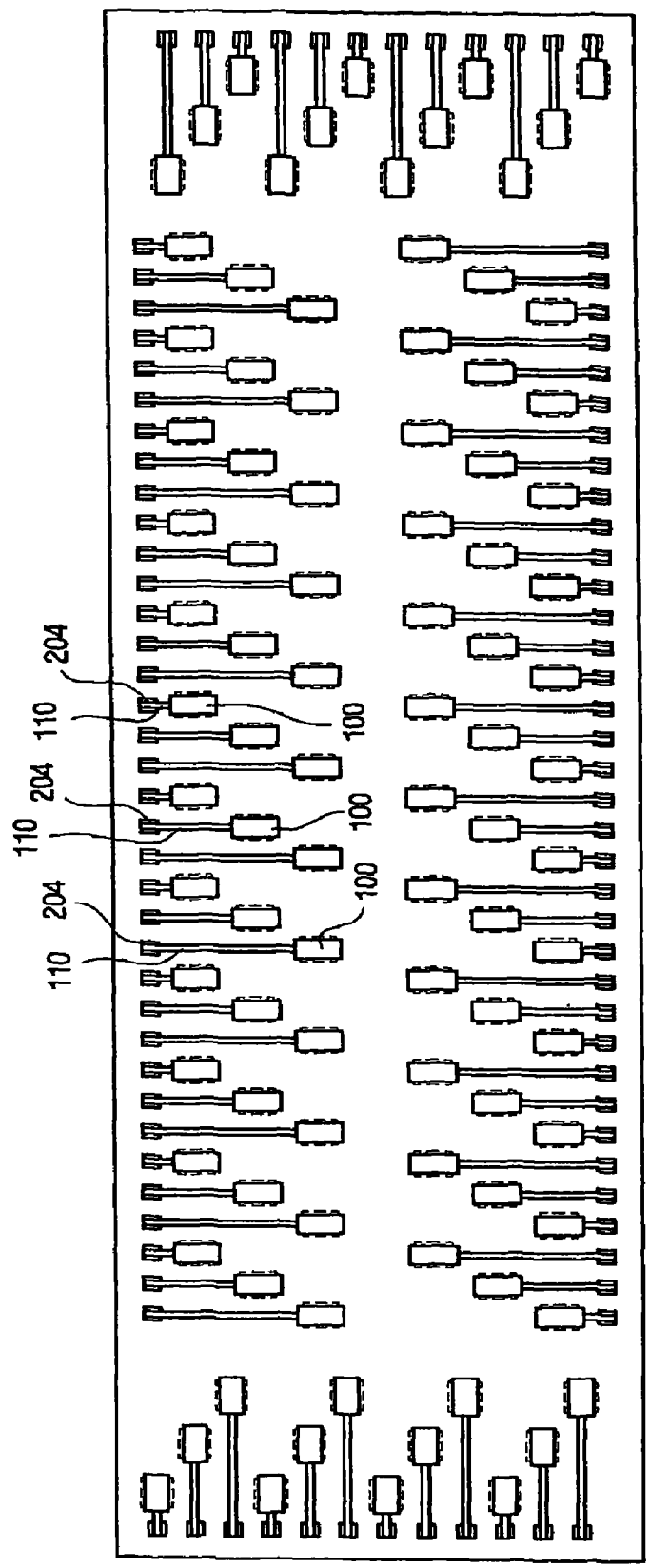
FIG. 9 illustrates a top down view of a semiconductor device having three groups of bump structures.

Furthermore, while two groups of aligned bump structures have been illustrated, it will be appreciated that more than two groups of bump structures, each offset from the other, may be formed. FIG. 9 illustrates a top down view of a semiconductor device having three groups of bump structures 100.

Method Embodiment

Next, a method of fabricating a semiconductor device having a bump structure according to the present invention will be described. For the purposes of example only, the method will be described with respect to the fabrication of the bump structure 100 illustrated in FIG. 1. The method will be described with respect to FIGS. 10A-15B where FIGS. 10A, 11A, 12, 13A, 14 and 15A represent cross-sectional views of the substrate during the fabrication process, and FIGS. 10B, 11B, 13B and 15B represent top down views of the substrate during the fabrication process.

Figure 10A:
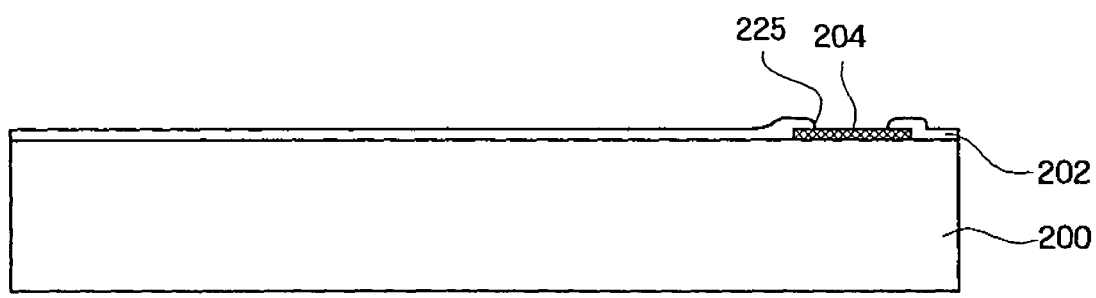
Figure 10B:
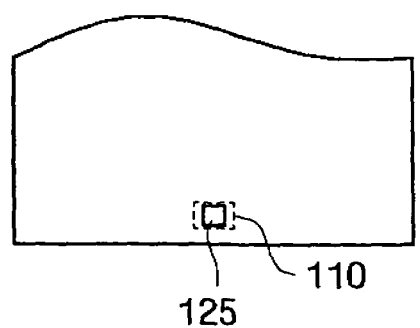

As shown in FIGS. 10A and 10B, the process begins with a substrate 200 having chip pads 204 formed thereon. For the purposes of clarity, only a single chip pad has been shown. Also, for clarity, the devices, circuits, etc. to which the chip pad 204 is electrically connected have not been shown. A first passivation layer 202 is formed over the substrate 200 and then patterned to expose a portion 225 of the chip pad 204. The first passivation layer 202 may be SiN, SiO2, or SiN+ SiO2, and may be formed by chemical vapor deposition (CVD).

Figure 11A:
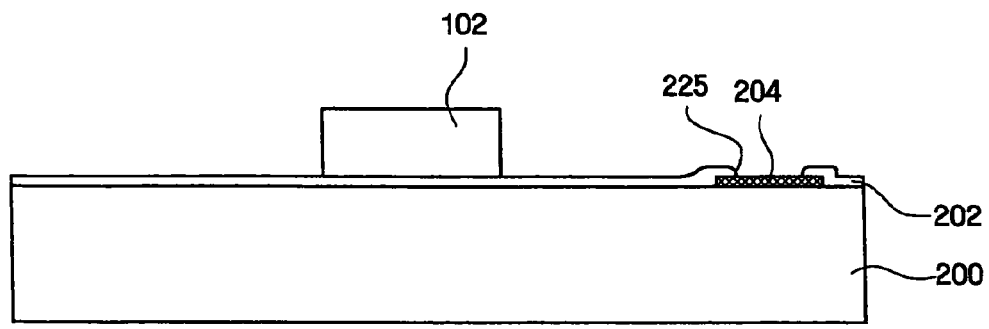
Figure 11B:
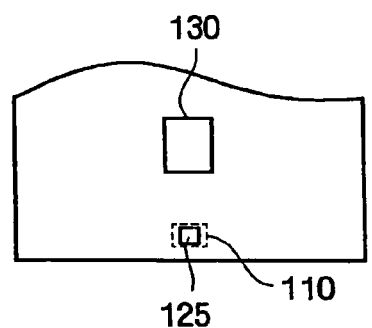

Next, a dielectric layer such as polyimide, BCB (Benzo Cyclo Butane), PBO (polybenzo oxazole), photosensitive resin, etc. is formed over the substrates; for example, by spin coating. The dielectric layer may be formed to a thickness of 2-30 um. Then, the dielectric layer is patterned using a mask to form non-conductive bumps 102 as shown in FIGS. 11A and 11B. The bumps 102 will have a height of 2-30 um, may have a width of 10-50 um and a length of 50-200 um. In one example embodiment, the width is 20 um and the length is 100 um.

Figure 12:
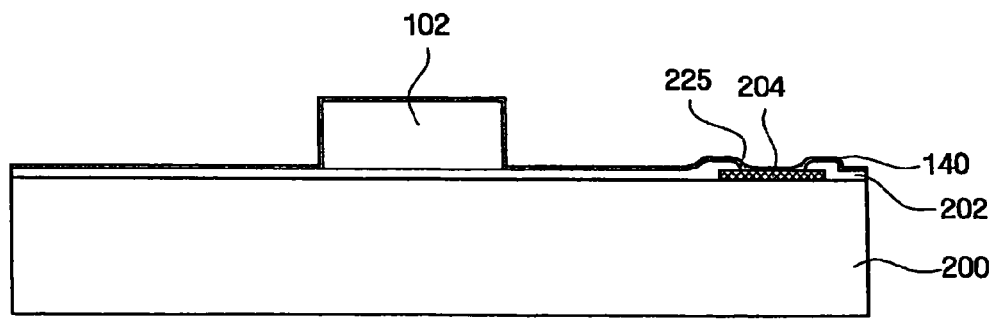

As shown in FIG. 12, a first metal layer 140 is formed over the substrate 200. The first metal layer 140 may have a thickness of 0.05-1 um. The first metal layer 140 may be formed of any metal having good adhesive properties and low electrical resistance such as TiW, Cr, Cu, Ti, Ni, NiV, Pd, Cr/Cu, TiW/Cu, TiW/Au, NiV/Cu, etc. Also the first metal layer 140 may be formed by a pressure vapor deposition (PVD) process, electro or electroless plating, etc. Also the first metal layer 140 may be formed by a pressure vapor deposition (PVD) process, electro or electroless plating, etc.

Figure 13A:
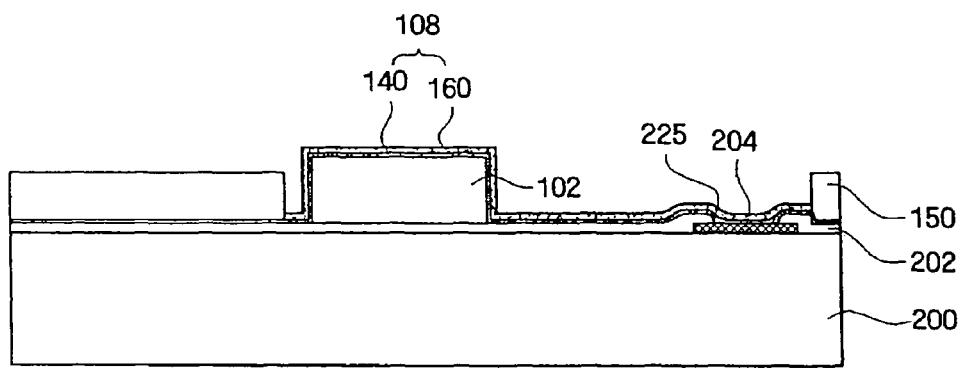
Figure 13B:
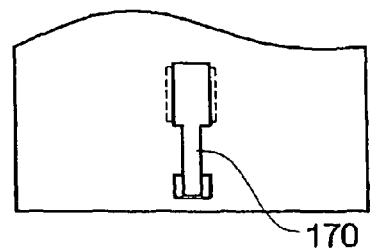

Next, as shown in FIGS. 13A and 13B, a photoresist pattern 150 is formed over the substrate 200. The photoresist pattern 150 forms a mask as shown in FIG. 13B. Using this mask, a second metal layer 160 is formed over portions of the substrate 200 exposed by the mask. The first and second metal layers 140 and 160 form the conductive layer 108 and the conductive line 110.

The second metal layer 160 may be formed to a thickness of 1-10 um. In one example embodiment, the combined thickness of the first and second metal layers 140 and 160 is less than 10 um. The second metal layer 160 may be formed of Au, Ni, Cu, Pd, Ag, etc., or multiple layers of these metals by electro plating, for example.

Figure 14:
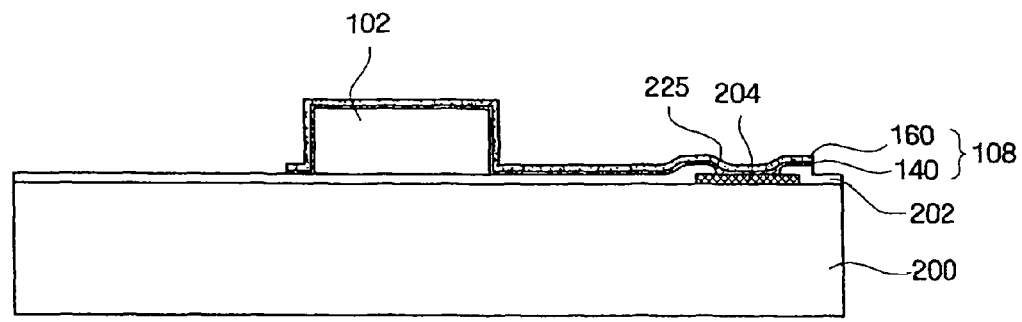
Figure 15A:
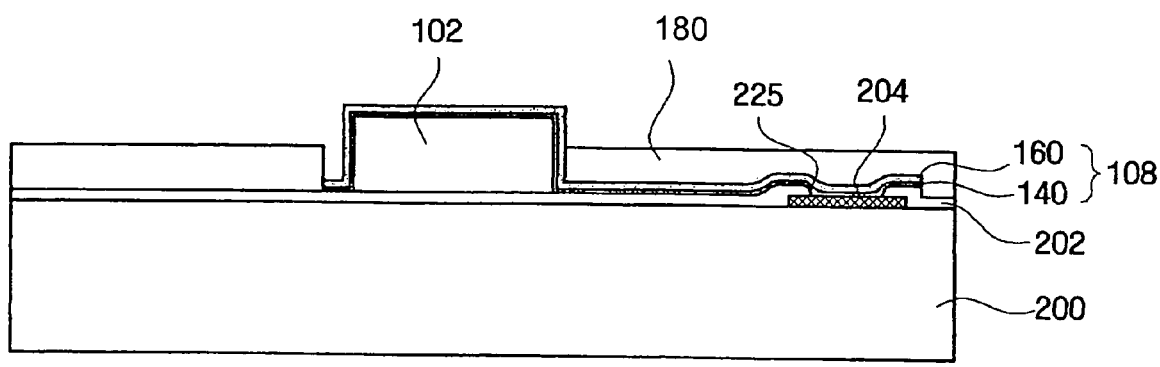
Figure 15B:
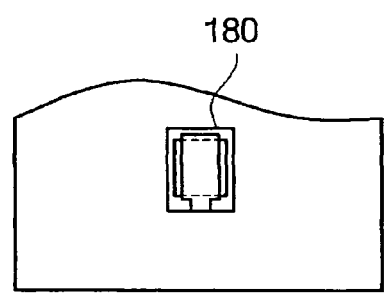

Afterwards, the photoresist pattern 150 is removed as shown in FIG. 14 leaving the bump structure 100 electrically connected to the pad 204. A second passivation layer 180 may then be formed over the substrate 200 and patterned to expose the bump structures 100 as shown in FIGS. 15A and 15B. The second passivation layer may be polyimide, BCB, PBO, photosensitive resin etc., and may be applied by a spin coating process.

The bump structures and method of fabrication described above may be applied to any technique in which bumps are used such as tape carrier package (TCP), chip on film (COF), and chip on glass (COG). Also, the bump structures and method of fabrication described above may be applied to the manufacture of any semiconductor chip or package (e.g., a liquid crystal display (LCD) driver integrated circuit (IC) package).

The invention being thus described, it will be obvious that the same may be varied in many ways. Such variations are not to be regarded as a departure from the invention, and all such modifications are intended to be included within the scope of the invention.

We claim:

1. A method of forming a semiconductor device, comprising:
    forming a plurality of bump structures arrayed along a substrate in a first direction, each bump structure having a width in the first direction greater than a pitch gap between successively arrayed bump structures, and at least one bump structure having a sidewall facing in the first direction that is non-conductive; and
    forming a conductive metal line including first and second metal layers, wherein after a photoresist mask is formed over the first metal layer, the second metal layer is formed over the portions of the substrate exposed by the photoresist mask, and each bump structure has one non-conductive sidewall facing in the first direction and one conductive sidewall facing in the first direction such that the conductive sidewall does not face the conductive sidewall of another bump structure.

2. The method of claim 1, wherein at least a bump structure of the plurality of bumps is disposed offset from one another in a second direction along the substrate.

3. The method of claim 1, wherein the first metal layer is formed by a PVD process, and the second metal layer is formed by electroplating.

4. The method of claim 1, wherein the forming a plurality of bumps step comprises:
    spin coating a bump material on the substrate; and
    patterning the bump material to form the plurality of bumps.

5. The method of claim 4, wherein each bump includes one of a polyimide, benzo cyclo butane, poly benzoxazole, and photosensitive resin.

6. The method of claim 4, wherein the patterning step forms the plurality of bumps such that each bump has a width of 10 to 50 um.

7. The method of claim 4, wherein the patterning step forms the plurality of bumps such that each bump has a height of 2-30 um.

8. The method of claim 1, wherein the first metal layer has a thickness of 0.05 to 1 um, and the second metal layer has a thickness of 1 to 10 um.

9. The method of claim 1, wherein the first metal layer includes at least one of TiW, Cr, Cu, Ti, Ni, NiV, Pd, Cr/Cu, TiW/Cu, TiW/Au, and NiV/Cu, and the second metal layer includes at least one of Au, Ni, Cu, Pd, Ag, and Pt.

10. The method of claim 1, wherein the forming a conductive line step comprises:
  forming the first metal layer; and
  electroplating the first metal layer with a second metal layer material to form the second metal layer.

11. A method of forming a semiconductor device, comprising:
  forming a plurality of bump structures arrayed along a substrate in a first direction, each bump structure having a width in the first direction greater than a pitch gap between successively arrayed bump structures, and at least one bump structure having a sidewall facing in the first direction that is non-conductive,
  forming a conductive metal line including first and second metal layers, wherein after a photoresist mask is formed over the first metal layer, the second metal layer is formed over the portions of the substrate exposed by the photoresist mask, and the array of bump structures alternate from a first type to a second type, the bump structure of the first type has two oppositely facing non-conductive sidewalls that face in the first direction, and the bump structure of the second type has each sidewall being conductive.

* * * * *